United States Patent [19]

Morioka et al.

[11] Patent Number: 4,849,700

[45] Date of Patent: Jul. 18, 1989

[54] DEVICE FOR DETECTING RESIDUAL CAPACITY OF BATTERY

[75] Inventors: Shizuo Morioka; Yuichi Saitoh, both of Tokyo, Japan

[73] Assignee: Kabushiki Kaisha Toshiba, Kawasaki, Japan

[21] Appl. No.: 168,233

[22] Filed: Mar. 15, 1988

[30] Foreign Application Priority Data

Mar. 19, 1987 [JP] Japan ................................ 62-39271

[51] Int. Cl.[4] ............................................. G01N 27/46
[52] U.S. Cl. ..................................... 324/427; 324/426; 324/430
[58] Field of Search ....................... 324/426, 427, 430; 340/636; 320/48

[56] References Cited

U.S. PATENT DOCUMENTS 4,193,025 3/1980 Frailing et al. ...................... 324/430
4,678,998 7/1987 Muramatsu ......................... 340/636

FOREIGN PATENT DOCUMENTS 2121971 1/1984 United Kingdom ................ 324/427

Primary Examiner—Reinhard J. Eisenzopf
Assistant Examiner—Anthony L. Miele
Attorney, Agent, or Firm—Finnegan, Henderson, Farabow, Garrett, & Dunner

[57] ABSTRACT

A device for detecting the residual capacity of a battery comprises a battery current measuring circuit for measuring battery current, a battery voltage measuring circuit for measuring battery voltage, a converting circuit for converting the measured current into a voltage value, based on the internal impedance of the battery, and a comparator circuit for comparing the conversion voltage value with the measured voltage. When the measured voltage is smaller than the conversion voltage value, the comparator circuit operates a battery residual-capacity detect signal indicating that the residual capacity of the battery is small.

8 Claims, 5 Drawing Sheets

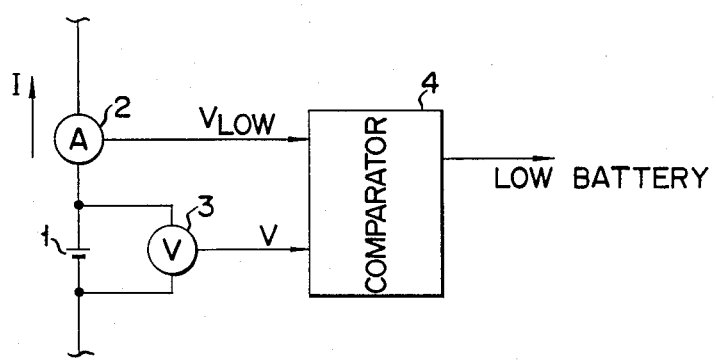
F I G. 2

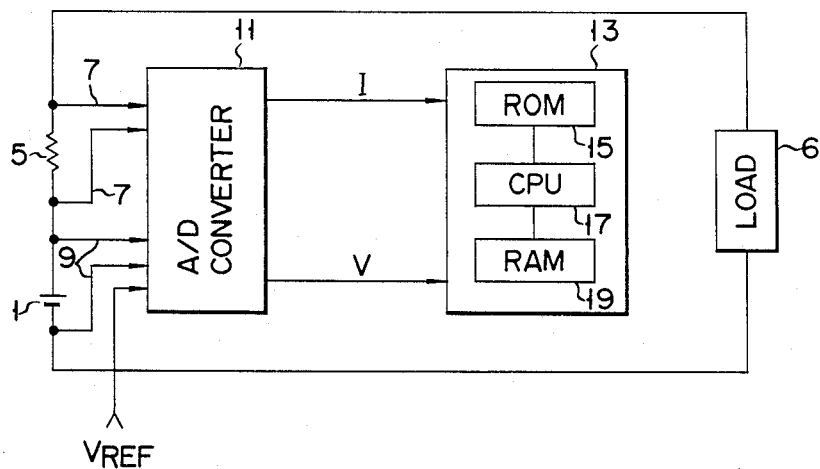
F I G. 4
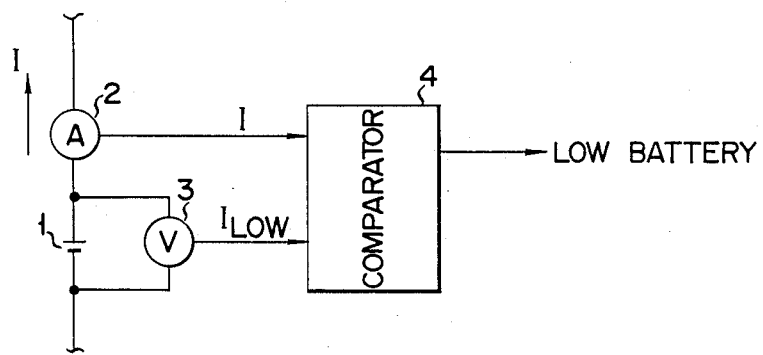
F I G. 6

DEVICE FOR DETECTING RESIDUAL CAPACITY OF BATTERY

BACKGROUND OF THE INVENTION

1. Field of the Invention

This invention relates to a device for detecting the residual capacity of a battery.

2. Description of the Related Art

A number of battery-operated electronic device are designed so that they produce an alarm when the residual capacity of their battery falls below a predetermined level during use. More specifically, the terminal voltage of the battery is monitored and compared with a reference voltage. When the terminal voltage is found to be below the reference voltage, an alarm is given, for example, as a sound, by an indicator lamp illuminating, or by an indicator blinking on a display screen.

However, as is shown in FIG. 1, the terminal voltage of a battery varies widely with the varying magnitude of a discharge current (variations in load). Thus, in the case of equipment in which large current variations (load variations) occur, when the discharge current is small an alarm will not given without extreme lowering of the residual capacity of battery. Where the discharge current is large, on the other hand, an alarm will be given even when the battery has sufficient residual capacity. Accordingly, by comparison between the terminal voltage of battery and the reference voltage alone, it is impossible to accurately detect the residual capacity of the battery.

U.S. Pat. No. 4,587,640, issued to Yuichi Saitoh and assigned to the same assignee as this application, discloses a cassette-type semiconductor memory device which comprises a RAM (random access memory) and a backup battery, and a voltage monitoring circuit, and can be connected to a data processor by way of a built-in connector. When the cassette is inserted into the connector of a processor the power supply of which is turned ON, a voltage is generated which is monitored. Upon detection of a voltage other than a normal voltage, access to the RAM is prohibited and a standby condition is set. When detecting that the voltage on a power line from the data processor has been raised to a normal value, the monitoring circuit issues a permission signal enabling access to the RAM to be resumed. With the prior art, however, variations in current dissipation on the power line are not taken into consideration.

The U.S. patent application titled "A Power Supply With A Built-In Microcomputer For Use In A Computer System" filed Dec. 17, 1987 by Takuma Yamasaki and Yuichi Saitoh, and bearing Ser. No. (unknown) discloses a power supply for a computer system. This power supply contains a microcomputer which confirms a saving operation of a computer system by communicating with the computer system and interrupting the power supply after confirmation.

In the application, however, no technique for varying a detection level of the residual capacity of a battery in accordance with the magnitude of a discharge current is disclosed.

SUMMARY OF THE INVENTION

It is an object of this invention to provide a device capable of accurately and simply detecting the residual capacity of a battery.

To achieve the object, a device of this invention comprises battery current measuring means for measuring a batter current to produce a signal proportional to the measured battery current; battery voltage measuring means for measuring a voltage of the battery to produce a signal proportional to the measured voltage of the battery; conversion means for converting one of the signal proportional to the measured battery current and the signal proportional to the measured battery voltage to a value corresponding to discharge characteristics of the battery; and comparison means for comparing the value with the other of the signal proportional to the measured battery current and the signal proportional to the measured battery voltage to produce a comparison signal.

According to this invention, since the terminal voltage of the battery taken as a reference for measuring the residual capacity can be varied, it becomes possible to accurately and simply detect the residual capacity of battery.

BRIEF DESCRIPTION OF THE DRAWINGS

Other objects and features of the present invention will be apparent from the following description taken in connection with the accompanied drawings in which:

FIG. 2 is a block diagram of an embodiment of the present invention;

FIG. 4 is a digital-type block diagram of the current measuring circuit, voltage measuring circuit and comparator of FIG. 2;

FIG. 6 is a block diagram in which a battery voltage is converted to a current to be compared with a battery current;

DETAILED DESCRIPTION OF THE PREFERRED EMBODIMENTS

Referring now to FIG. 2 a current measuring circuit 2 is connected in series with a battery 1. Further, a voltage measuring Circuit 3 is connected in parallel with battery 1. Current measuring circuit 2 converts a current I of battery 1 to a value (conversion voltage value) based on the internal impedance of the battery, thus outputting it as a signal $V_{LOW}$. Voltage measuring circuit 3 outputs a signal V representing the voltage of battery 1. Conversion voltage signal $V_{LOW}$ and voltage signal V are applied to a comparator circuit 4 to be compared therein. When signal V is smaller than signal $V_{LOW}$, comparator circuit 4 determines that the residual capacity of the battery is small, thus outputting an alarm signal. This alarm signal is applied to a data processor not shown, for example. The data processor is responsive to the alarm signal to sound a loudspeaker, blink a display, or light an exclusive indicator lamp.

Figure 1:
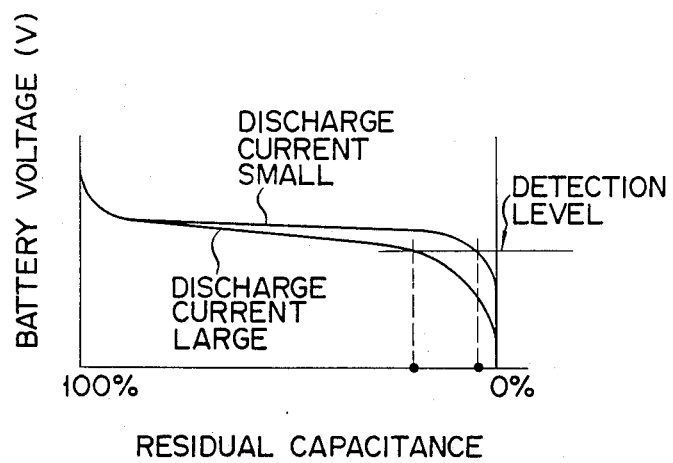
FIG. 1 is a diagram showing different detection levels for alarm due to different magnitudes of discharge current in a prior art.
Figure 3:
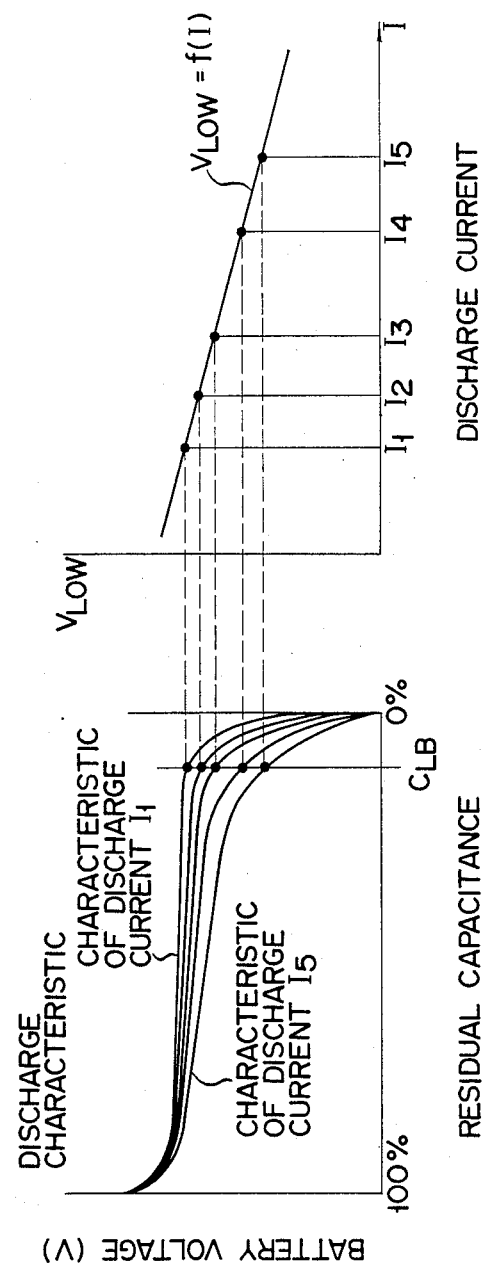
FIG. 3 shows a relationship of the detection level for alarm to different magnitudes of the discharge current of a battery according to the present invention.

As shown in FIG. 3, the battery current I is converted in accordance with a function $V_{LOW}=f(I)$ based on the internal impedance of the battery. Therefore, the measured value $V_{LOW}$ can vary with the value of measured battery current I. In other words, the detected voltage value used for determining the residual capacity of battery 1 can be varied in accordance with the value I of current flowing out of battery 1. Thus, the constant residual capacity (CLB in FIG. 3) of battery 1 can be detected irrespective of the value of the discharge current of battery 1.

The function f(I) conforms to the discharge characteristics of battery 1. This function represents how the voltage of battery 1 varies with the residual capacity thereof. It is to be noted, however, that the terminal voltage is a function of the discharge current as well as a function of the residual capacity. Therefore, depending upon the terminal voltage alone makes impossible to accurately detect whether the residual capacity of the battery has fallen below a predetermined level (namely, Low Battery).

Assuming that the discharge capacity is h (=an integral value of discharge current with respect to time, i.e. $\int I\, dt$), the value of discharge capacity at which Low Battery is detected is $h_{LOW}$, the terminal voltage of the battery is $V_T$ and the discharge current is I, the terminal voltage $V_T$ will be equivalently represented by $$V_T = f1\ (I, h) \qquad (1)$$

Thus, at a time when Low Battery should be detected the terminal voltage is represented as follows.

$$V_T = f1\ (I, h_{LOW}) = f2(I)$$

where hLOW is a constant value.

If $V_{LOW} \geq V_T$, the battery is regarded as "Low Battery". Thus, VLOW (the terminal voltage retarded as Low Battery) is given by $$V_{LOW} \geq V_T = f1(I, h_{LOW}) = f2(I) = f(I)$$

Accordingly, by a comparison between VLOW and the measured terminal voltage V the case $V_{LOW} = f(I) \geq V$ can be regarded as Low Battery.

Examples of f(I) will be indicated below. f(I) may be expressed by a linear function of I as $f(I) = a - bI$ where a is a coefficient related to electromotive force of the battery, and b is a coefficient related to the internal resistance of the battery. Moreover, where the internal resistance of the battery varies with the discharge current, it follows that $f(I) = a - f3(I)$.

That is, the number of factors to consider increases or decreases in accordance with the type of a battery to detect Low Battery, the manufacturer of the battery, the extent of variations in the discharge current (load variations), and the accuracy with which Low Battery is detected. Thus, for simplification of the description, this embodiment is described in terms of the function $V_{LOW} = f(I)$.

FIG. 4 is a practical block diagram of the embodiment shown in FIG. 2. A series circuit is composed of a load 6, battery 1 and current detecting resistor 5. The discharge current of battery 1 is applied by current detecting resistor 5 to a first input of analog-to-digital (A/D) converter 11 via a line 7. The voltage of battery 1 is applied to a second input of A/D converter 11 via a line 9. Further, a reference voltage VREF for A/D conversion is applied to a third input of A/D converter 11. A/D converter 11 converts the analog current and analog voltage applied to the first and second inputs thereof into corresponding digital values for application to an arithmetic circuit 13. Arithmetic circuit 13 is composed of a central processor unit (CPU) 17, a read only memory (ROM) 15 coupled to CPU 17, and a random access memory (RAM) 19 coupled to CPU 17. Arithmetic circuit 13 and A/D converter 11 may be formed of the four-bit microcomputer TMP47C440AF manufactured by Toshiba. Arithmetic circuit 13 converts an input current to a conversion voltage signal $V_{LOW}$ in accordance with the function $V_{LOW}32\ f(I)$ based on the internal impedance of battery 1 described above. Thereafter, arithmetic circuit 13 makes a comparison between the conversion voltage signal $V_{LOW}$ and the measured voltage V and detects "Low Battery" when $V_{LOW} \geq V$.

In the case of the above conversion process, the current I is converted to $V_{LOW}$ using the compensating function $V_{LOW} = f(I)$. Alternatively, values of $V_{LOW}$, which are previously calculated in accordance with the compensating function, may be stored in ROM 15 in the form of a current-conversion value lookup table. In this case, by referring to the table the conversion voltage signal can be obtained.

Figure 5:
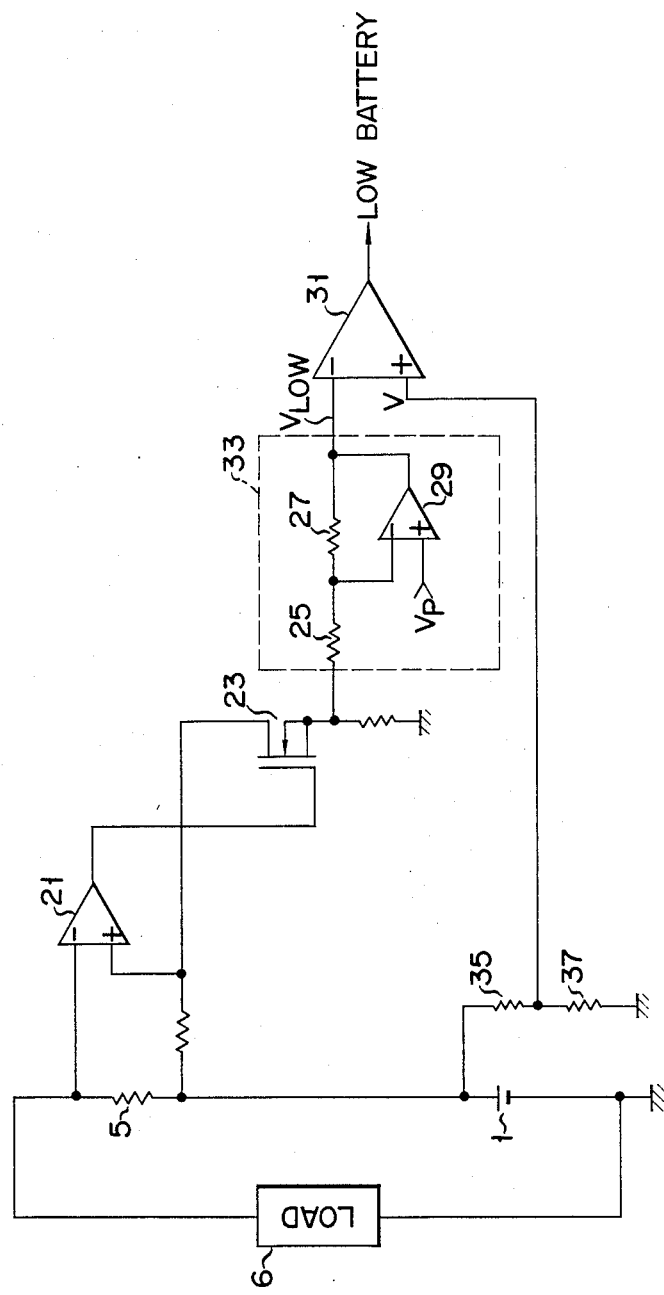
FIG. 5 is an analog-type block diagram of the current measuring circuit, voltage measuring circuit and comparator of FIG. 2.

With the embodiment of FIG. 4, the measured analog current is converted into the corresponding digital value for the subsequent compensation and comparison. FIG. 5 shows another embodiment of this invention in which the conversion (compensation) and comparison are performed in the form of analog signals. In FIG. 5 like reference numerals are used to denote the same parts as those in FIG. 4.

The discharge current of battery 1 is applied via current detecting resistor 5 to an inverting input of an operational amplifier 21. The output of operational amplifier 21 is coupled via a field effect transistor (FET) 23 to a compensating circuit 33 composed of resistors 25 and 27 and an operational amplifier 29. Compensating circuit 33 performs the conversion based on $V_{LOW} = -f(I)$. A converted voltage signal $V_{LOW}$ is applied from compensating circuit 33 to an inverting input of a comparison operational amplifier 31.

On the other hand, a divided output voltage V of a voltage divider formed of resistors 35 and 37 is applied to a noninverting input of operational amplifier 31. As a result, operational amplifier 31 produces a Low Battery signal when $V_{LOW} \geq V$. The embodiment of FIG. 5 can provide the same advantage as in the embodiment of FIG. 4.

With the embodiments as described above, the discharge current of battery 1 is converted into a conversion voltage value in accordance with the compensating function $V_{LOW} = f(I)$ Alternatively, as shown in FIG. 6, the discharge voltage of battery 1 may be converted into a conversion current value in accordance with a compensating function based on the internal admittance of battery 1 so that the conversion current value is compared with the discharge current I of battery 1.

The way for compensating the discharge voltage of battery may be the same as that for compensating the discharge current of battery.

That is, rearranging equation (1), i.e. $V_{LOW} = f_1(I, h)$ yields $I = g_1(V_T, h)$, $I_{LOW} = g_2(V_T)$. $g_2(V_T)$. In the case of the linear function $V_T = f(I) = a - bI$. Rearranging it yields $$\text{ti } I_{LOW} = g_2(VT) = a/b - V_T/b = a' - b'V \qquad (2)$$

Figure 7:
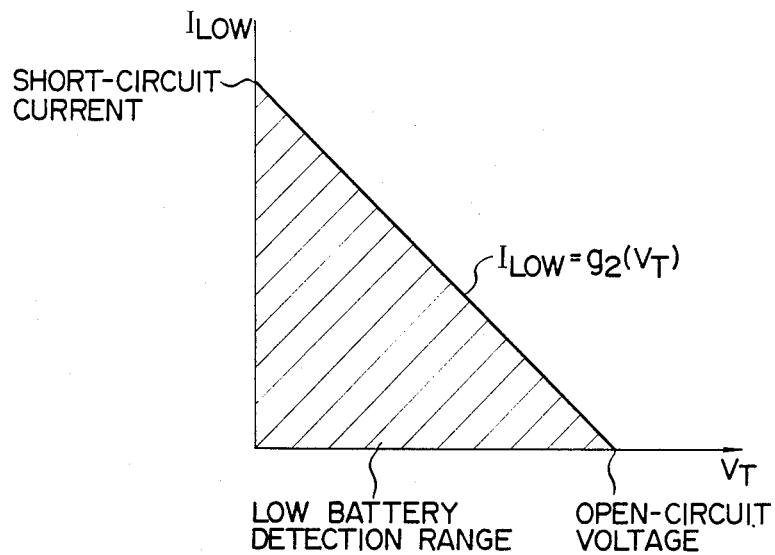
FIG. 7 shows a graph showing a function used for compensating the battery voltage.

Equation (2), i.e. $I_{LOW} = g^2\ (V_T)$ is graphically represented in FIG. 7. In equation (2) a' is a coefficient related to short-circuit current, and b' is a coefficient related to the admittance of the battery.

By the use of the circuit of FIG. 4 or FIG. 5 the measured voltage of battery 1 is converted into conversion current value ILOW, and then this conversion value is compared with the discharge current I of battery 1 to recognize Low Battery when $I_{LOW} \geqq \geqq I$.

Figure 8:
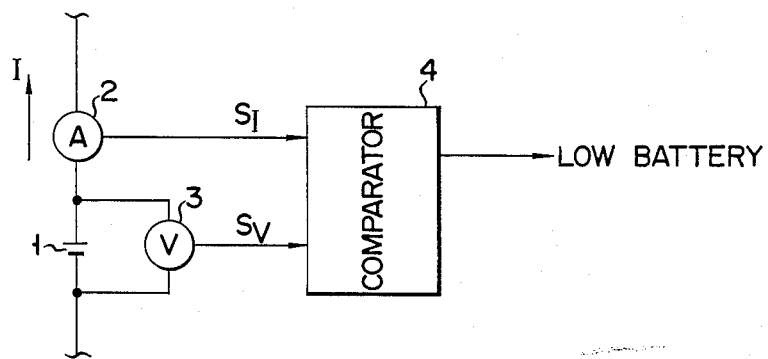
FIG. 8 is a block diagram in which both the battery current and the battery voltage are converted for a subsequent comparison.

FIG. 8 shows a further embodiment of the present invention. In this embodiment the measured discharge current I is converted into a conversion value Si, and the measured battery voltage is converted into a conversion value Sv so that the two conversion values are compared by comparator 4. In this case the conversion values may be determined from the type and performance of a battery to be used, and the specifications offered by the battery manufacturer. These conversion values can be previously stored in ROM 15 in FIG. 4 in the form of table. Otherwise, the embodiment of FIG. 8 may be implemented by the use of discrete circuit components as shown in FIG. 5.

What is claimed is:

1. A device for detecting the residual capacity of a battery, comprising:
   current measuring means for measuring a discharge current of the battery;
   voltage measuring means for measuring a voltage of the battery;
   converting means for converting one of the measured discharge current of the battery and the measured battery voltage into a value conforming to discharge characteristics of the battery; and
   comparing means for comparing the conversion value with the other of the measured discharge current of the battery and the measured battery voltage, to output the result of comparison in the form of a residual capacity detect signal.

2. A device for detecting the residual capacity of a battery, comprising:
   current measuring means for measuring a discharge current of the battery;
   voltage measuring means for measuring a voltage of the battery;
   converting means for converting the measured discharge current of the battery into a value, based on an internal impedance of the battery; and
   comparing means for comparing the conversion value with the measured battery voltage, to output the result of comparison in the form of a residual capacity detect signal.

3. The device according to claim 2, wherein said comparing means outputs an alarm signal indicating that the residual capacity of the battery is small when the measured voltage is detected to be smaller than the conversion value.

4. The device according to claim 2, wherein the value obtained by said converting means is a voltage value based on a compensating function $V_{LOW}=f(I)$ where $V_{LOW}$ is a detection level voltage used for detecting Low Battery, and I is a discharge current of the battery.

5. A device for detecting the residual capacity of a battery, comprising:
   current measuring means for measuring a discharge current of the battery;
   voltage measuring means for measuring a voltage of the battery;
   converting means for converting the measured battery voltage into a value, based on an internal admittance of the battery; and
   means for comparing the conversion value with the measured discharge current of the battery, to output the result of comparison in the form of a residual capacity detect signal.

6. The device according to claim 5, wherein said comparing means outputs an alarm signal indicating that the residual capacity of the battery is small when the measured discharge current of the battery is detected to be smaller than the conversion value.

7. The device according to claim 5, wherein the value obtained by said converting means is a current value based on a compensating function $I_{LOW}=g(V_T)$ where $I_{LOW}$ is a detection level current adapted for detecting low battery, and $V_T$ is the measured voltage of the battery.

8. A device for detecting the residual capacity of a battery, comprising:
   current measuring means for measuring a discharge current of the battery;
   voltage measuring means for measuring a voltage of the battery;
   converting means for converting the measured discharge current of the battery into a first value, based on an internal impedance of the battery, and the measured battery voltage into a second value, based on an internal admittance of the battery; and
   means for making a comparison between the first and second values, to output the result of comparison in the form of a residual capacity detect signal.

* * * * *